(12) United States Patent
Grek et al.

(10) Patent No.: US 6,507,405 B1
(45) Date of Patent: Jan. 14, 2003

(54) FIBER-OPTIC INTERFEROMETER EMPLOYING LOW-COHERENCE-LENGTH LIGHT FOR PRECISELY MEASURING ABSOLUTE DISTANCE AND TILT

(75) Inventors: Boris Grek, Santa Clara, CA (US); Raymond J. Ellis, Fremont, CA (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/313,104

(22) Filed: May 17, 1999

(51) Int. Cl.[7] ................................................. G01B 9/02
(52) U.S. Cl. ........................ 356/479; 356/482; 356/497
(58) Field of Search ................................ 356/479, 482, 356/477, 497

(56) References Cited

U.S. PATENT DOCUMENTS

| | | | | |
|---|---|---|---|---|
| 5,898,496 A | * | 4/1999 | Huang et al. | 356/350 |
| 5,910,840 A | * | 6/1999 | Fürstenau | 356/351 |
| 6,137,561 A | * | 10/2000 | Imai | 355/55 |

* cited by examiner

Primary Examiner—Frank G. Font
Assistant Examiner—Phil Natividad
(74) Attorney, Agent, or Firm—Allston L. Jones

(57) ABSTRACT

Disclosed are first and second embodiments of a 3-channel probe-plate structure of the fiber-optic interferometer, wherein low-coherent-length light from a superluminescent light-emitting diode is split by a tree splitter into three light branches which are coupled as separate light inputs to the probe-pate structure by single-mode, polarization-preserving optical fibers. For each of the 3 channels, the first embodiment of the probe-plate structure comprises an integrated polarizing lithium-niobate Y splitter-modulator for deriving separate reference-arm light and probe-arm light. The reference-arm light is transmitted as an air-path reference light beam directed parallel to the probe plate surface from a transmitting gradient-index microlens to a receiving gradient-index microlens, while the probe-arm light is transmitted as an air-path probe light beam directed to be incident on a movable surface at a glancing angle from a transmitting gradient-index microlens and then be reflected from the movable surface to a receiving gradient-index microlens. The received reference-arm light and probe-arm light, for each of the 3 channels, are combined in an integrated polarizing lithium-niobate Y combiner-modulator and the combined light is forwarded to a light detector by an optical fiber. The second embodiment of the probe-plate structure differs from the first embodiment thereof only in that (1) single transmitting and single receiving gradient-index microlens-grating combinations (which derive the separate air-path reference and probe light beams) replace the two transmitting gradient-index microlens and two receiving gradient-index microlens of the first embodiment, and (2) both the splitter-modulators and combiner-modulators in the second embodiment are located on the receiving side of the air-path light beams.

21 Claims, 11 Drawing Sheets

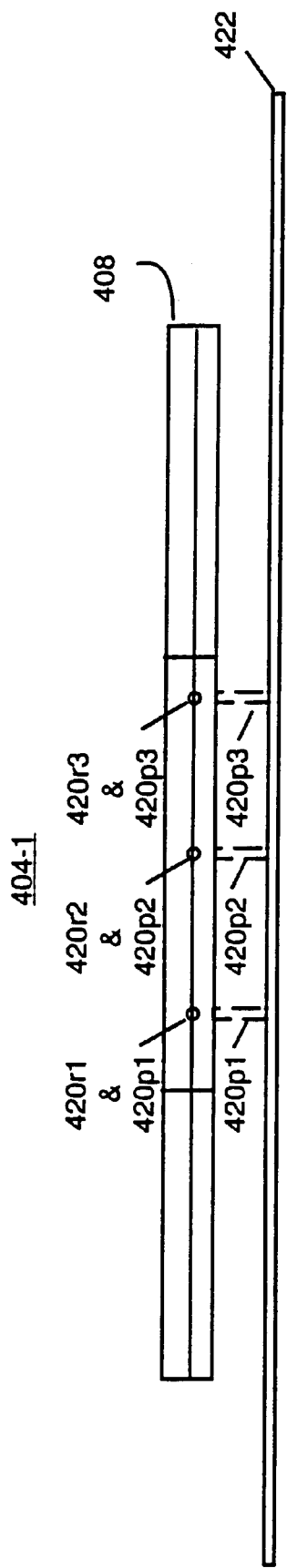

ical microlithography projection system). Thus, any two-dimensional tit of the wafer's resist-coated surface with
FIBER-OPTIC INTERFEROMETER EMPLOYING LOW-COHERENCE-LENGTH LIGHT FOR PRECISELY MEASURING ABSOLUTE DISTANCE AND TILT

FIELD OF THE INVENTION

The present invention relates to a fiber-optic interferometer employing low-coherence-length light and, more particularly, to such a fiber-optic interferometer suitable for use as a metrology tool in the projection optical system of a microlithographic stepper that, after each successive step of the stepper, provides data for controlling the movement of the plane of a movable wafer surface into precise coincidence with the plane of the focus field of an image of one or more reticle patterns.

DESCRIPTION OF THE PRIOR ART

In optical microlithography, as known in the art, an image of tiny spatial patterns is projected on a resistcoated surface of a workpiece, such as a silicon wafer by way of an illustrative example. The wafer may be located on a stepper having six degrees of freedom that employs a computer-controlled servo means to precisely position the wafer so that the focal plane of the projected image of tiny spatial patterns coincides with the wafer's resistcoated surface (i.e., the wafer's resist-coated surface is positioned within the very small depth of focus of a high numerical aperture optical microlithography projection system). Thus, any two-dimensional tit of the wafer's resist-coated surface with respect to the focal plane of the projected image must be avoided. However, each time the wafer is moved by the stepper, some tilt is likely to occur between the wafer's resist-coated surface with respect to the focal plane of the projected image. Therefore, each time the wafer is moved by the stepper, it is necessary to control the operation of the stepper to correct for any resulting two-dimensional tilt that has occurred.

One of several ways known by the art to precisely determine whether the wafer's resist-coated surface is tilted with respect to the focal plane of the projected image is to employ an air gauge means employing air probes to measure the respective distances at each of three or more laterally displaced points of the wafer's resist-coated surface between the wafer's surface and that surface of the projection optics which is closest in distance to the wafer's surface. The respective values of these three or more measurements are supplied to the computer controlling the servo means, thereby permitting the computer-controlled servo means to achieve desired two-dimensional tilt-free positioning of the stepper (i.e., the wafer's surface is precisely positioned parallel to that surface of the projection optics which is closest in distance to the wafer's surface).

One disadvantage of employing air probes for this purpose is that the air probes cannot be physically situated directly within the projected field, but, instead, must be laterally offset outside of the projected field. Thus, each of the three measurements has to be made at a point which is laterally displaced from all points within the projected field itself.

SUMMARY OF THE INVENTION

The fiber-optic interferometer of the present invention is responsive to light generated by a light source that has a coherence length over a given range that is sufficiently low to cause the peak intensity of output light from the fiber-optic interferometer for each interference fringe other than a principal interference fringe to be lower than the peak intensity output light for the principal interference fringe by a significantly noticeable amount that depends on the absolute value of the number of wavelengths of the low-coherence-length light that that interference fringe is displaced in distance from the principal interference fringe. This permits this fiber-optic interferometer to measure the absolute distance of any point that may vary a given distance value from the point at which the principal interference fringe occurs by an amount which is within a given range of distance values, which given range is many times larger than the wavelength of the low-coherence-length light. Further, this fiber-optic interferometer may be utilized to ascertain the amount of tilt of a movable surface with respect to a reference surface by measuring, at each of at least three displaced points on the reference surface that do not lie in a straight line, the absolute distance between that reference-surface point and a corresponding point on the movable surface.

DESCRIPTION OF THE PREFERRED EMBODIMENTS

Figure 1:
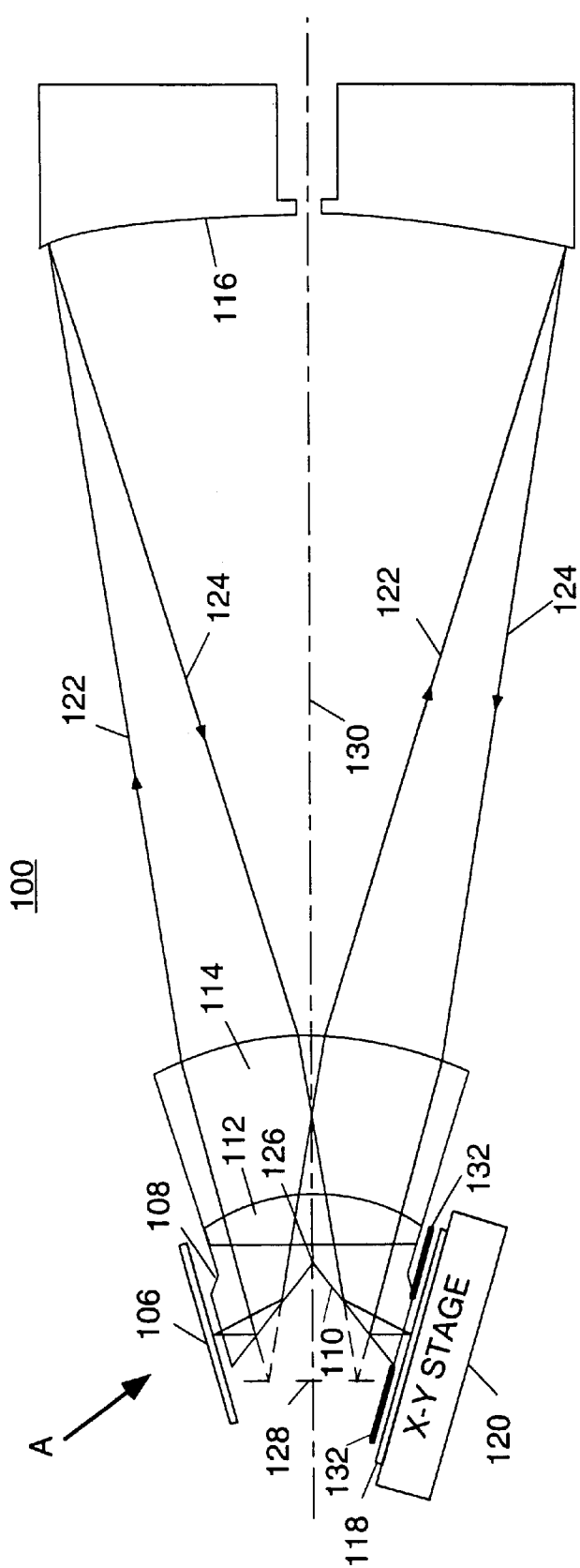
FIG. 1 diagrammatically illustrates an embodiment of a 1:1 magnification, telecentric, full-field, folded Wynne Dyson type optical stepper system.

An embodiment of a 1:1 magnification, telecentric, full-field, folded Wynne Dyson type optical stepper system 100 is diagrammatically illustrated in FIG. 1. As is typical in prior-art Wynne Dyson stepper systems, system 100 also incorporates reticle 106 that has a selected transparent pattern thereon, first and second folding prisms 108 and 110, piano lens 112, meniscus lens 114, spherical mirror 116, and wafer 118 disposed on X-Y stage 120. Illumination for system 100 may be directed into the system through reticle 106, as indicated by arrow A, to derive light rays 122 incident on mirror 116 and light rays 124 reflected from mirror 116. Folding prisms 108 and 110, which have an apex 126, separate the object and image planes which would otherwise be superimposed at focal plane 128, thereby separating a circular field into two symmetrical halves with respect to optical axis 130 which becomes an object plane at reticle 106 and an image plane at wafer 118. Attached to the bottom of folding prism 110, and integral therewith, is probe plate 132 having an aperture therethrough to permit the focused light rays emerging from the bottom of folding prism 110 to reach the image plane at wafer 118

In the prior art, means such as three air probes of an air gauge were mounted directly on a probe plate similar to probe plate 132 at points laterally displaced from the aforesaid aperture for measuring the distance between the surface of wafer 118 and the bottom of folding prism 110 at each of three or more displaced points (not lying in a straight line) to thereby determine the amount of 2D tilt, if any, of the surface of wafer 118 with respect to the bottom of folding prism 110. The nominal focus distance between the surface of wafer 118 and the bottom of folding prism 110 has a particular value within a range between 3 mm and 6 mm (i.e., about 118 to 236 mils). However, due to the occurrence of 2D tilt and surface character of wafer 118 with respect to and the bottom of folding prism 110, the distance at any measuring point between the surface of wafer 118 and the bottom of folding prism 110 may vary over a range of ±10 mils (about ±250 μm) with respect to the nominal focus distance.

Figure 2:
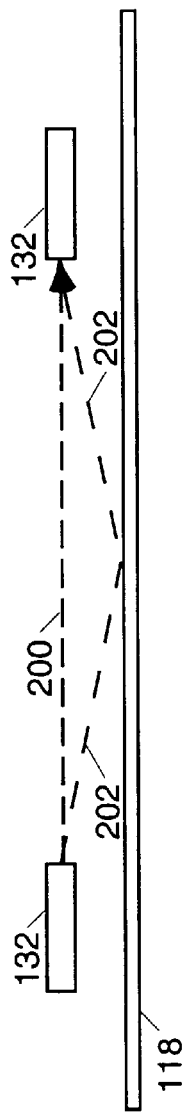
FIGS. 2 and 2a illustrate the basic principle of the present invention for maintaining the surface of a workpiece, such as a silicon wafer, within the focal distance of the folded Wynne Dyson type optical stepper system of FIG. 1 by the use of interferometry between two beams of light from a low-coherence-length light source to precisely measure a distance having a value within this low-coherence-length.

In accordance with the basic principle of the present invention, interferometry between two beams of light from a low-coherence-length light source, which is capable of precisely measuring distance to a small fraction of a light wavelength over a large distance range, such as ±10 mils (about ±250 μm), that is equal to many light wavelengths. In this regard, reference is made to FIG. 2. As schematically shown in FIG. 2, reference light beam 200 and probe light beam 202, which are derived from a common low-coherence-length light source by a first means (not shown in FIG. 2) attached to the left side of probe plate 132, are directed across the aperture in probe plate 132 to a second means including a detector (not shown in FIG. 2) attach to the right side of probe plate 132. As indicated in FIG. 2, (1) the direction of reference light beam 200 across the probe-plate aperture to the second means is parallel to probe plate 132 and (2) the direction of probe light beam 202 across the probe-plate aperture to the detector is such as to first be incident at a glancing angle on the surface of wafer 118 and then be reflected from the surface of wafer 118 to the second means.

So long as the total path length of reference light beam 200 from the common low-coherence-length light source of the first means to the decor of the second means differs from the total path length of probe light beam 202 from the common low-coherence-length light source of the first means to the detector of the second means by an amount which does not exceed the coherence-length of these light beams, some interference will take place in the second means which will be detected as being within that particular one of an ordinal series of successive interference fringes (shown in FIG. 2a) indicated by the absolute value of the peak amplitude of the detected interference fringe. Specifically, due to the low-coherence-length of the reference and probe light beams 200 and 202, interference between of probe light beam 202 and reference light beam 200 results in principal interference fringe 204 of the ordinal series having the maximum detected peak amplitude absolute value and each other interference fringe (e.g., interference fringes 206 and 208) of the ordinal series resulting from either a negative (−) or positive (+) displacement from principal interference fringe 204 having a lower detected peak amplitude absolute value than the peak amplitude absolute value of its immediately preceding displaced interference fringe (e.g., interference fringes 210 and 212) from principal interference fringe 204. Therefore, the peak amplitude absolute value of a detected interference fringe (which is indicative of its ordinal position within the series of successive interference fringes shown in FIG. 2a) may be used as an absolute gross measure of distance with a precision of one light wavelength. Then, the actual amplitude of the detected interference fringe determined by the second means relative to its peak amplitude may be used to refine the measure of distance with a precision of a small fraction of one light wavelength.

Figure 3:
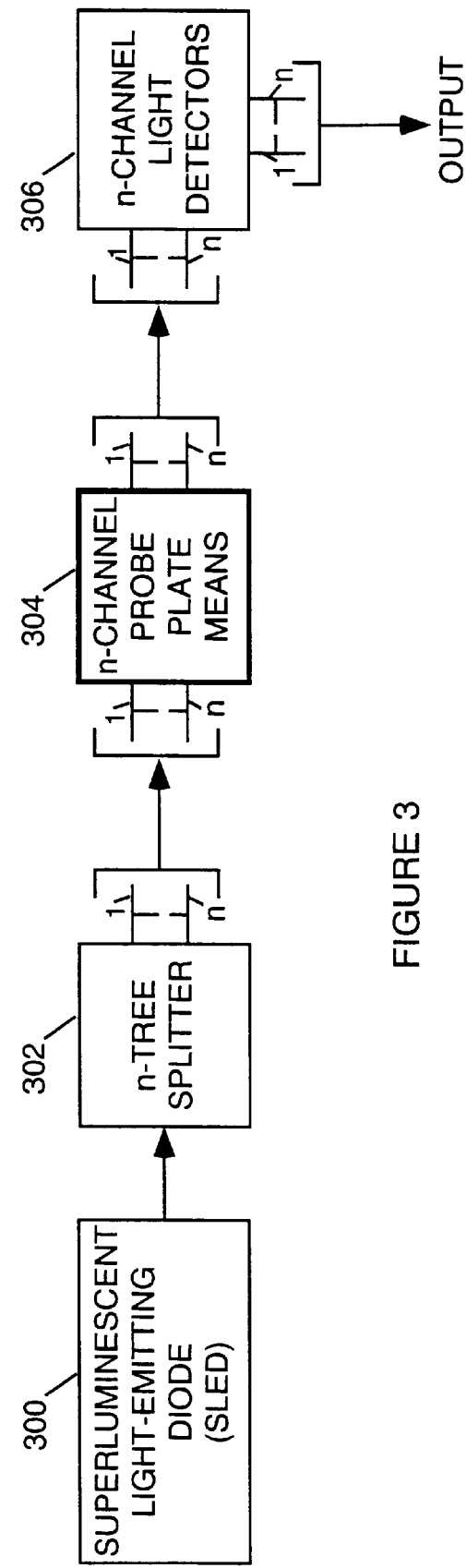
FIG. 3 is a block diagram of a first preferred embodiment of the present invention.

Referring now to FIG. 3, there is shown a block diagram of a first preferred embodiment the present invention comprising superluminescent light-emitting diode (SLED) 300, n-tree splitter 302, n-channel probe plate means 304 and n-channel light detectors 306. As known, a superluminescent light-emitting diode, such as SLED 300, has been recently developed which constitutes a high-brightness light source having a low coherence length (i.e., less than a few millimeters (mm)), as opposed to a laser diode which has a high coherence length (i.e., greater than a few mm). Specifically, for descriptive purposes, SLED 300 is assumed to have a nominal bandwidth of 830 nanometers (nm) and a relatively broad bandwidth greater than 20 nm. As indicated in FIG. 3, the light output from SLED 300 is coupled as an input to n-tree splitter 302; the n split light outputs from n-tree splitter 302 are coupled as n inputs to n-channel probe plate means 304, and the n light outputs from n-channel probe plate means 304 are coupled as n inputs to n-channel light detectors 306. All the foregoing light coupling is accomplished by means of recently developed single-mode, polarization-preserving optical fibers. Each one of the n channel light detectors of n-channel light detectors 306 derives a voltage output having a current value corresponding to the intensity of the light applied as an input to that one of the n channel light detectors.

The respective values of the n voltage outputs from n-channel light detectors 306 may be digitized and then applied as control inputs to computer-controlled servo means (not shown) that is capable of precisely positioning X-Y stage 120, shown in FIG. 1, of a stepper having six degrees of freedom so that the surface of wafer 118 coincides with and is exactly parallel (i.e., not 2D tilted) to the image plane of the projection optics shown in FIG. 1.

Figure 3A:
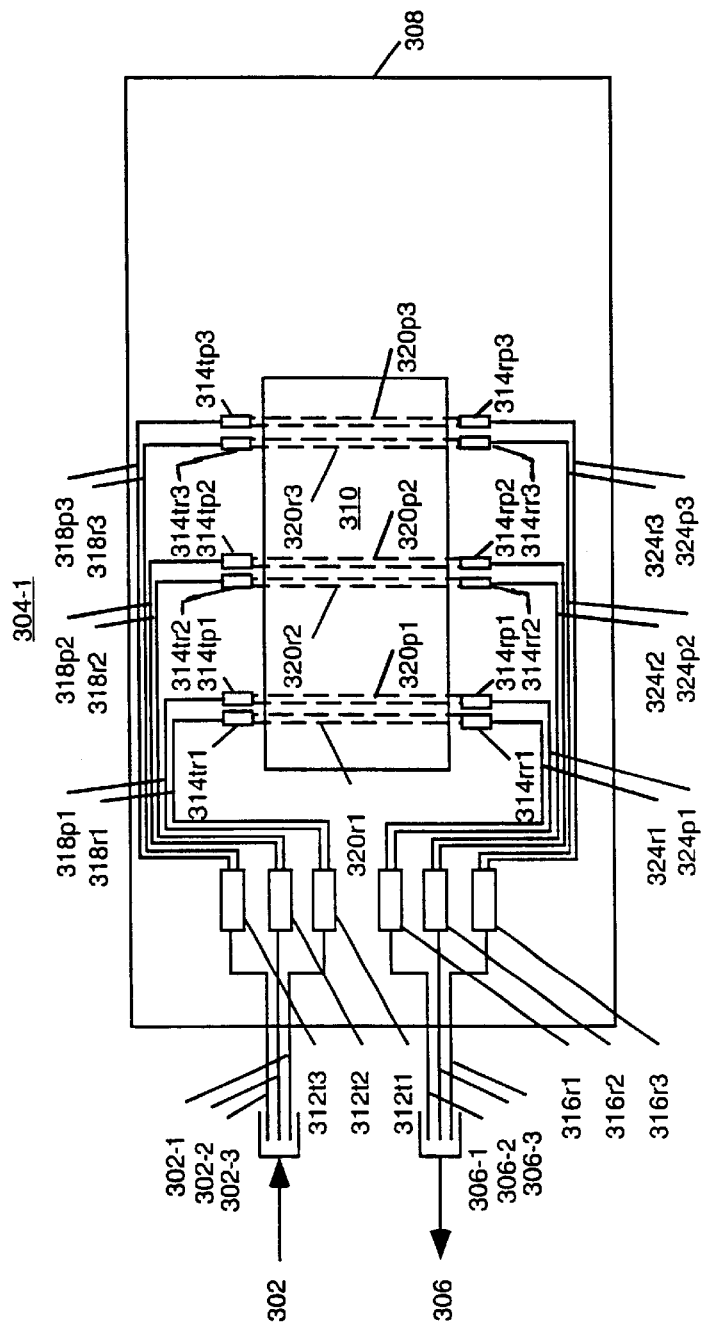
FIG. 3a schematically shows a plan view and FIG. 3b schematically shows a side view of a preferred embodiment of the n-channel probe plate means of FIG. 3 for the particular case of a 3channel probe plate means.
Figure 3B:
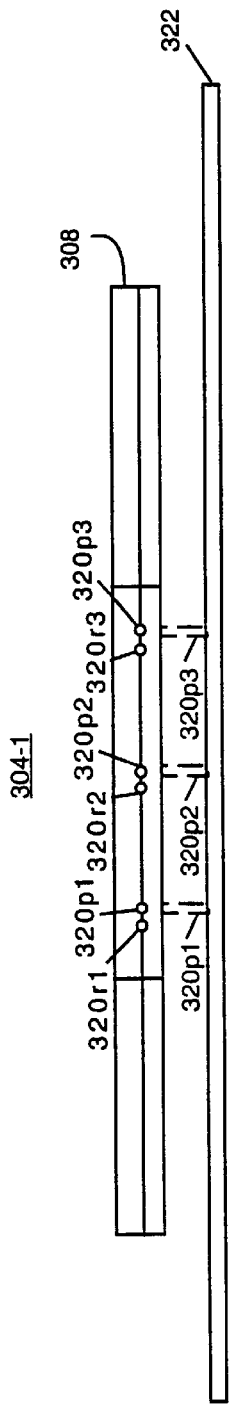

Reference is now made to FIGS. 3a and 3b, which together schematically shows in detail a preferred embodiment 304-1 of the n-channel probe plate means 304 of FIG. 3 for the particular case of a 3-channel probe plate means. Shown in FIGS. 3a and 3b is probe plate 308 (e.g., probe plate 132 of FIG. 1) having an aperture 310 therein. Attached to probe plate 308 are (1) a set of three integrated polarizing lithium-niobate Y splitter-modulators 312t1, 312t2 and 312t3, (2) a first set of three gradient index (GRIN) collimating microlenses 314tr1, 314tr2 and 314tr3, (3) a second set of three GRIN collimating microlenses 314tp1, 314tp2 and 314tp3, (4) a third set of three GRIN collimating microlenses 314rr1, 314rr2 and 314rr3, (5) a fourth set of three GRIN collimating microlenses 314rp1, 314rp2 and 314rp3 and (6) a set of three integrated polarizing lithium-niobate Y combiner-modulators 316r1, 316r2 and 316r3. Single-mode, polarization-preserving optical fibers (which, for the sake of clarity in the drawing, are schematically shown in FIG. 3a) are employed for coupling light between the aforesaid elements attached to probe plate 308. (In reality, each single-mode, polarization-preserving optical fiber comprises a very small (e.g., 4 $\mu$m) diameter thread, permitting two or more of the optical fibers to be bundled together so that the optical path lengths of the optical fibers in a bundle remain nearly equal.)

Specifically, the light from each of optical fibers 302-1, 302-2 and 302-3 from tree splitter 302 is coupled as an input to its corresponding ordinal one of splitter-modulators 312t1, 312t2 and 312t3. Each of splitter-modulators 312t1, 312t2 and 312t3 splits its input light into reference output light and probe output light. The reference output light from each of splitter-modulators 312t1, 312t2 and 312t3 is coupled as an input to its corresponding ordinal one of GRIN collimating microlenses 314tr1, 314tr2 and 314tr3 by the corresponding ordinal one of optical fibers 318r1, 318r2 and 318r3 and the probe output light from each of splitter-modulators 312t1, 312t2 and 312t3 is coupled to its corresponding ordinal one of GRIN collimating microlenses 314tp1, 314tp2 and 314tp3 by the corresponding ordinal one of optical fibers 318p1, 318p2 and 318p3. In a similar manner, the probe output light from each of splitter-modulators 312t1, 312t2 and 312t3 is coupled as an input to its corresponding ordinal one of GRIN collimating microlenses 314tp1, 314tp2 and 314tp3 by the corresponding ordinal one of optical fibers 318p1, 318p2 and 318p3.

Transmitting GRIN collimating microlenses 314tr1, 314tr2 and 314tr3 are all oriented to transmit each of the respective reference beams of light 320r1, 320r2 and 320r3 through an air path substantially parallel to plate 308 toward the corresponding ordinal one of receiving GRIN collimating microlenses 314rr1, 314rr2 and 314rr3. However, transmitting GRIN collimating microlenses 314tp1, 314tp2 and 314tp3 are all oriented to transmit each of the respective probe beams of light 320p1, 320p2 and 320p3 through an air path in such direction to be incident at a glancing angle on the surface of a member 322 (e.g., wafer 118 of FIG. 1) and then be reflected toward the corresponding ordinal one of receiving GRIN collimating microlenses 314rp1, 314rp2 and 314rp3, as is also indicated in FIG. 3b. Because each of the respective probe beams is incident at a glancing angle, the incident light of each of the respective probe beams has a polarization which tends to maximize the intensity of the reflected light derived therefrom. Further, the broad band character of the light used (bandwidth greater than 20 nm at 830 nm) eliminates many annoying effects that occur when using highly coherent light such as special effect and interference patterns that occur upon reflection from coherent structures. In any event, the light from each of receiving GRIN collimating microlenses 314rr1, 314rr2 and 314rr3 is coupled as a first input to its corresponding ordinal one of combiner-modulators 316r1, 316r2 and 316r3 by its corresponding ordinal one of optical fibers 324r1, 324r2 and 324r3 and the light from each of receiving GRIN collimating microlenses 314rp1, 314rp2 and 314rp3 is coupled as a second input to its corresponding ordinal one of combiner-modulators 316r1, 316r2 and 316r3 by its corresponding ordinal one of optical fibers 324p1, 324p2 and 324p3. Finally, the combined output light from each of combiner-modulators 316r1, 316r2 and 316r3 is forwarded by its corresponding ordinal one of optical fibers 306-1, 306-2 and 306-3 to light detectors 306.

Air turbulence and temperature gradients tend to induce detrimental relative phase shift between the reference and probe arms in probe plate means 304-1 means shown in FIGS. 3a and 3b. However, probe plate means 304-1 uses near common paths for both the optical fiber and air paths, which reduces these detrimental relative phase shifts. Specifically, this use of near common paths is accomplished in probe plate means 304-1 by (1) the use glancing angles for the respective probe beams of light 320p1, 320p2 and 320p3 and locating each pair of corresponding reference and probe beams of light in dose proximity to one another so that they share the same air volume. This effectively cancels out any phase shifts due to the longer wavelength air turbulence. Further, the optical fibers associated with each pair of corresponding reference and probe beams are routed along substantially the same paths in order to eliminate (or, at least, substantially minimize) temperature gradient effects.

Figure 4:
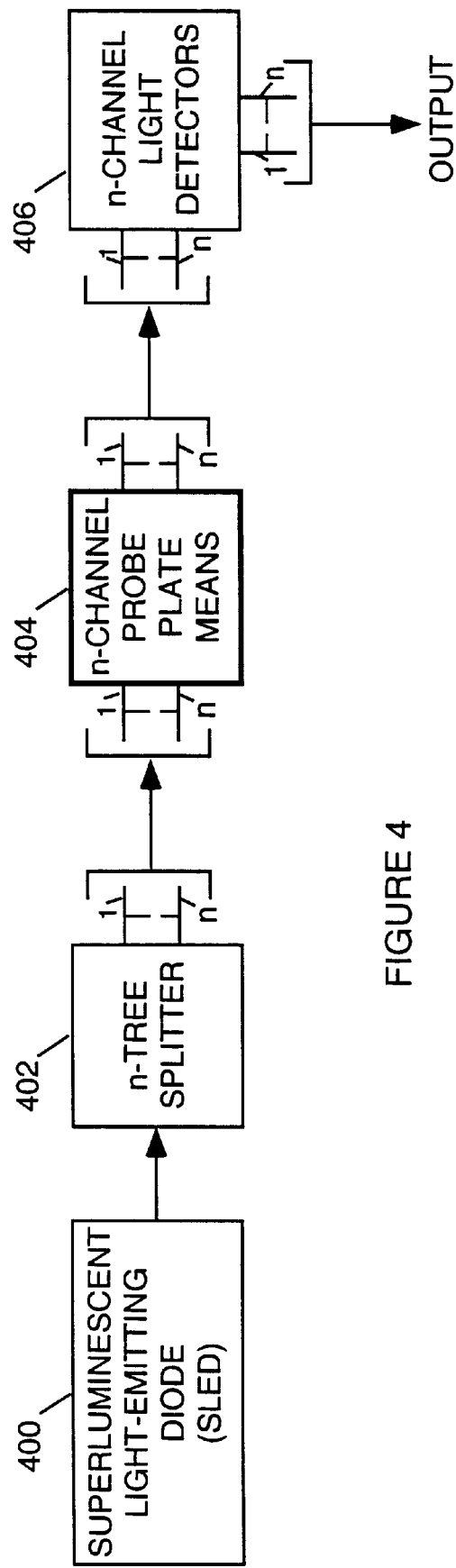
FIG. 4 is a block diagram of a second preferred embodiment of the present invention.

Referring now to FIG. 4, there is shown a block diagram of a second Preferred embodiment the present invention comprising SLED 400, n-tree splitter 402, n-channel probe plate means 404 and n-channel light detectors 406. With the exception of the fact that n-channel probe plate means 404 (a preferred embodiment of which is schematically shown in detail in FIGS. 4a and 4b described below) differs substantially in structure from n-channel probe plate means 304 (a preferred embodiment of which is schematically shown in detail in FIGS. 3a and 3b described above), each of the other elements (i.e., SLED 400, n-tree splitter 402, and n-channel light detectors 406) of FIG. 4 is similar in structure and function to the corresponding element of FIG. 3.

Figure 4A:
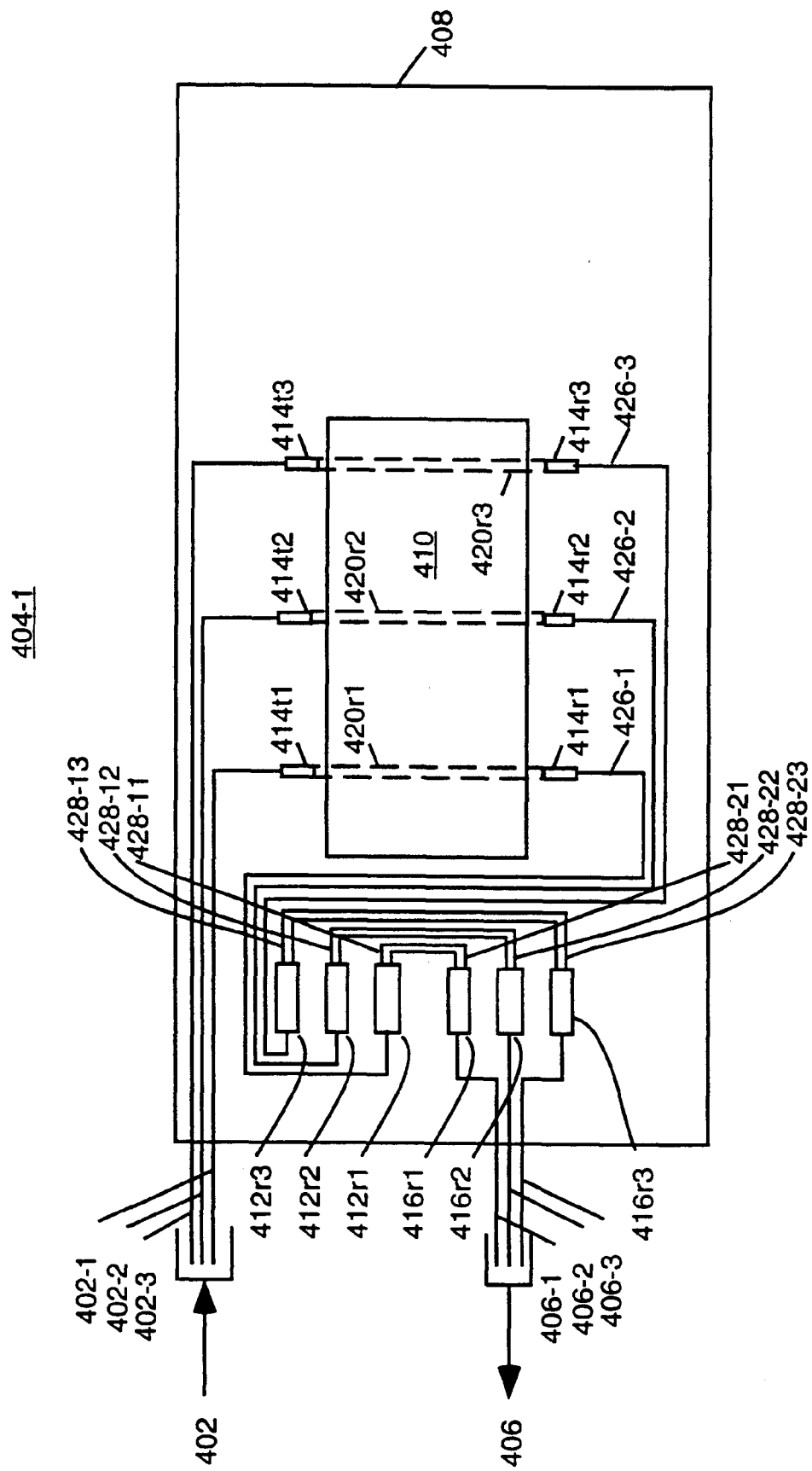
FIG. 4a schematically shows a plan view and FIG. 4b schematically shows a side view of a preferred embodiment of the n-channel probe plate means of FIG. 4 for the particular case of a 3channel probe plate means.

Reference is now made to FIGS. 4a and 4b, which together schematically show in detail a preferred embodiment 404-1 of the n-channel probe plate means 404 of FIG. 4 for the particular case of a 3-channel probe plate means. Shown in FIGS. 4a and 4b is probe plate 408 (e.g., probe plate 132 of FIG. 1) having an aperture 410 therein. Attached to probe plate 408 are (1) a set of three integrated polarizing lithium-niobate Y splitter-modulators 412r1, 412r2 and 412r3, (2) a set of three GRIN combined collimating microlenses and gratings 414t1, 414t2 and 414t3, (3) a second set of three GRIN combined collimating microlenses and gratings 414r1, 414r2 and 414r3, and (4) a set of three integrated polarizing lithium-niobate Y combiner-modulators 416r1, 416r2 and 416r3.

Specifically, the light from each of optical fibers 402-1, 402-2 and 402-3 from tree splitter 402 is directly coupled as an input to its corresponding ordinal one of GRIN combined collimating microlenses and gratings 414t1, 414t2 and 414t3. Each of GRIN combined collimating microlenses and gratings 414t1, 414t2 and 414t3 is oriented so that the grating thereof is effective in (1) transmitting a corresponding ordinal one of zero-order reference light beams 420r1, 420r2 and 420r3 substantially parallel to plate 408 toward the corresponding ordinal one of receiving GRIN combined collimating microlenses and gratings 414r1, 414r2 and 414r3 and (2) transmitting a corresponding ordinal one of first-order probe light beams 420p1, 420p2 and 420p3 (see FIG. 4b) through an air path in such direction to be incident at a glancing angle on the surface of a member 422 (e.g., wafer 118 of FIG. 1) and then be reflected toward the corresponding ordinal one of receiving GRIN combined collimating microlenses and gratings 414r1, 414r2 and 414r3.

The output light from each of receiving GRIN combined collimating microlenses and gratings 414r1, 414r2 and 414r3 is coupled as an input to its corresponding ordinal one of splitter-modulators 412r1, 412r2 and 412r3 by a corresponding ordinal one of optical fibers 426-1, 426-2 and 426-3. Each of splitter-modulators 412r1, 412r2 and 412r3 splits its input light into (1) first output light which is coupled as a first input to its corresponding ordinal one of combiner-modulators 416r, 416r2 and 416r3 by a corresponding ordinal one of optical fibers 428-11, 428-12 and 428-13, and (2) second output light which is coupled as a second input to its corresponding ordinal one of combiner-modulators 416r, 416r2 and 416r3 by a corresponding ordinal one of optical fibers 428-21, 428-22 and 428-23. Finally, the combined output light from each of combiner-modulators 416r, 416r2 and 416r3 is forwarded by its corresponding ordinal one of optical fibers 406-1, 406-2 and 406-3 to light detectors 406. The respective optical path lengths of these fibers are adjusted to equalize the total optical paths of the reference and probe light beams. In practice, the aforesaid optical fibers may be made integral with the aforesaid splitter-modulators and combiner-modulators.

Figure 5:
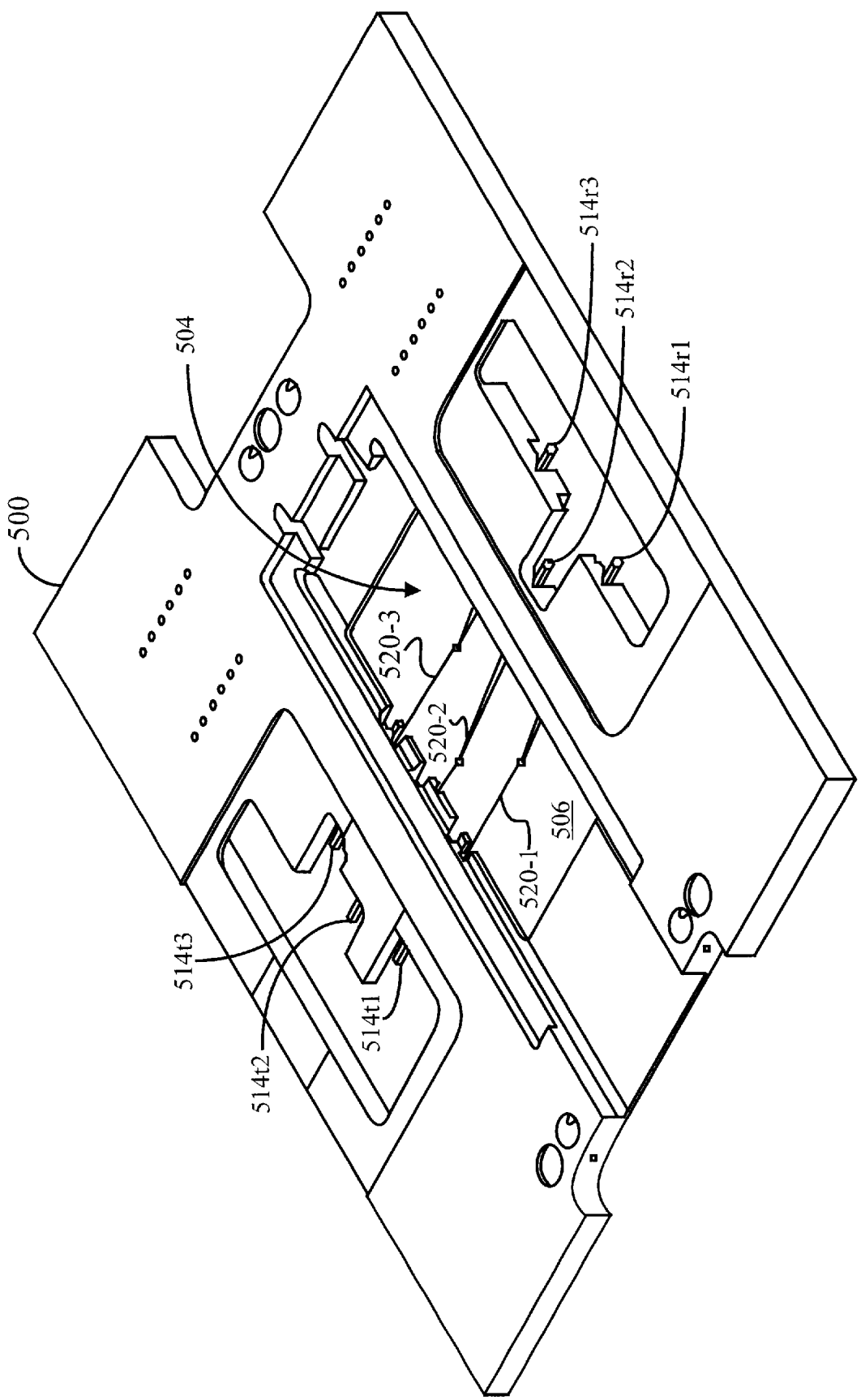
FIG. 5 is a structural diagram of a preferred embodiment of the probe plate employed both in the 3-channel probe plate means of FIGS. 3a–3b and FIGS. 4a–4b combined with collimating microlens and grating optics employed sole*y in the 3-channel probe plate means of FIGS. 4a–4b, either of which preferred embodiment of the probe plate is suitable for use as the probe plate of the optical stepper system shown in FIG. 1.

Referring now to FIG. 5, there is shown a structural diagram of probe plate 500, which is a preferred embodiment of both probe plate 308 of FIGS. 3a–3b and probe plate 408 of FIGS. 4a–4b. As shown in FIG. 5, probe plate 500 (which is suitable for use as probe plate 132 of the optical stepper system of FIG. 1) comprises (1) a first group of three spatially displaced V-groove cavities, disposed in the bottom of probe plate 500 to the left of aperture 504, in which corresponding ones of a set of three GRIN combined collimating microlenses and gratings 514t1, 514t2 and 514t3 are installed, (2) a second group of three spatially displaced V-groove cavities, disposed in the bottom of probe plate 500 to the right of aperture 504, in which corresponding ones of a set of three GRIN combined collimating microlenses and gratings 514r1, 514r2 and 514r3 are installed, (3) a third group of three spatially di ed empty V-groove cavities, each of which is disposed in the bottom of probe plate 500 to the left of aperture 504 in close proximity to its corresponding one of the V-groove cavities of the first group, and (4) a fourth group of three spatially displaced empty V-groove cavities, each of which is disposed in the bottom of probe plate 500 to the right of aperture 504 in close proximity to its corresponding one of the V-groove cavities of the second group.

As indicated in FIG. 5, (1) the three GRIN combined collimating microlenses and gratings 514t1, 514t2 and 514t3 are spatially positioned with respect to one another to form a first triangle, (2) the three GRIN combined collimating microlenses and gratings 514r1, 514r2 and 514r3 are spatially positioned with respect to one another to form a second triangle and (3) the respective distances between the first pair of microlenses and gratings 514t1 and 514r1, the second pair of microlenses and gratings 514t2 and 514r2 and the third pair of microlenses and gratings 514t3 and 514r3 are all equal to one another. Therefore, the air paths of the respective probe-light beams 520-1, 520-2 and 520-3 are incident at three displaced spots on an underlying surface 506, such that the respective locations of these three displaced spots on the underlying surface 506 defines a triangle.

It is apparent from the above description, that, as shown, probe plate 500 of FIG. 5 is for use as probe plate 408 of FIGS. 4a 4b, rather than for use as probe plate 308 of FIGS. 3a–3b. However, probe plate 500 could be made for use as probe plate 308 of FIGS. 3a–3b by (1) installing a set of three transmitting reference GRIN collimating microlenses (instead three transmitting GRIN combined collimating microlenses and gratings) in the V-groove cavities of the first group, (2) installing a set of three receiving reference GRIN collimating microlenses (instead three receiving GRIN combined collimating microlenses and gratings) in the V-groove cavities of the second group, (3) installing a set of three transmitting probe GRIN collimating microlenses in the empty V-groove cavities of the third group, and (4) installing a set of three receiving probe GRIN collimating microlenses in the empty V-groove cavities of the fourth group.

Assuming the design of probe plate 500 is used as probe plate 132 and underlying surface 506 to be the surface of wafer 118 of the optical stepper system of FIG. 1, the relatively long distance parallel to probe plate 500 between each corresponding pair of the three transmitting and receiving microlenses (i.e. the length of the air path of a reference-light beam and the length of the horizontal component of the air path of a probe-light beam) is about 4 centimeters (cm), while the range of the relatively short distance between bottom of probe plate 500 and underlying surface 506 is only about 560±250 $\mu$m and probe-light beam is incident on underlying surface 506 at a glancing angle of about 6°. Further, the diameter of each of a reference-light beam and a probe-light beam is about 300 $\mu$m, while the wavelength of the low-coherence-length light of each of a pair of reference and probe light beams is about 830 nm.

In the operation of probe plate means 304-1, schematically shown in FIGS. 3a and 3b, each of lithium-niobate Y splitter-modulators 312t1, 312t2 and 312t3 performs a required first function in splitting the single light beam input thereto into separate reference and probe light arm outputs therefrom, while each of lithium-niobate Y combiner-modulators 316r1, 316r2 and 316r3 performs a required first function of combining the separate reference and probe light arm inputs thereto into a single light beam output therefrom. More specifically, a relative optical delay between the reference and probe light beams may be adjusted by moving the GRIN lenses reference light paths in their V grooves in probe plate 500.

Figure 6:
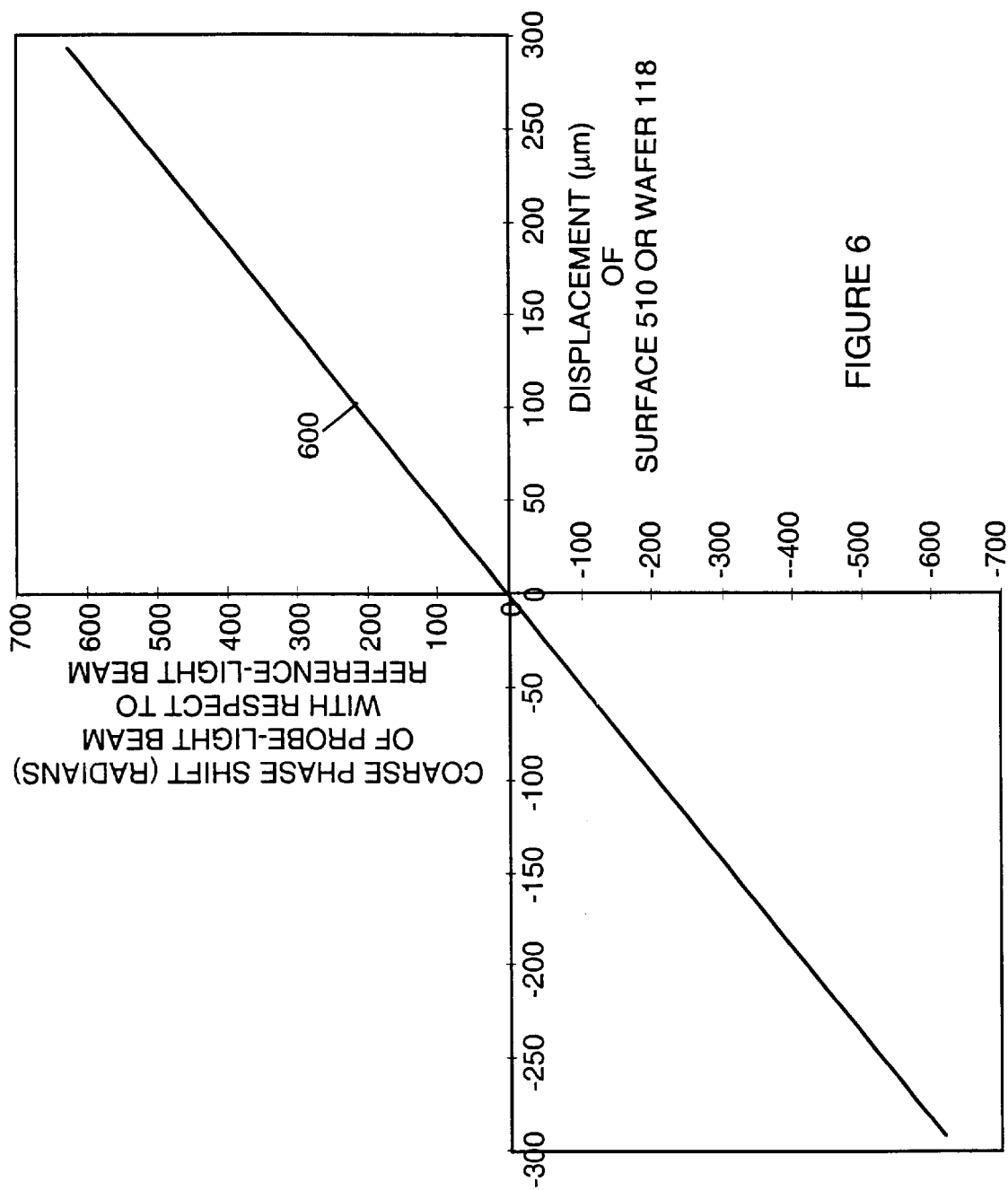
FIG. 6 is a graph showing the quantitative relationship between coarse phase shift and surface displacement in the operation of both the first and second preferred embodiments of the present invention.
Figure 7:
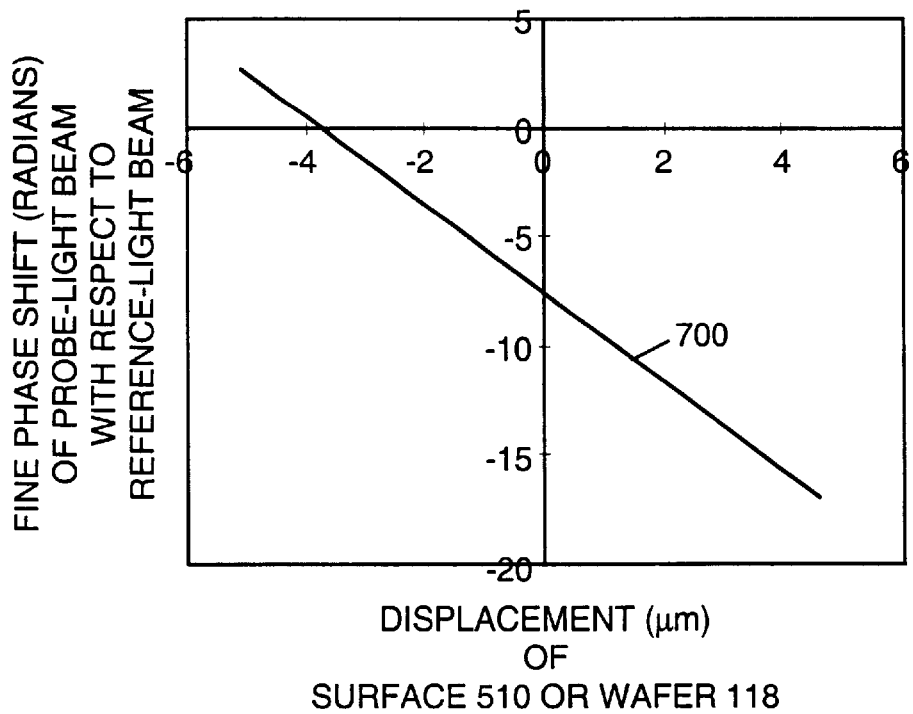
FIG. 7 is a graph showing the quantitative relationship between fine phase shift and surface displacement in the operation of both the first and second preferred embodiments of the present invention.

However, each one of each pair of corresponding ordinal ones of splitter-modulators 312t1, 312t2 and 312t3 and combiner-modulators 316r1, 316r2 and 316r3 also performs a second function of phase shifting the reference and probe light arms in a push-pull manner with respect to one another in accordance with the magnitude of a modulating voltage applied thereto In a first preferred case, the modulating voltage first applied to each of splitter-modulators 312t1, 312t2 and 312t3 and each of combiner-modulators 316r1, 316r2 and 316r3 is scanned at least once between a relatively large maximum negative value of magnitude, −M, and a relatively large maximum positive value of magnitude, +M, thereby providing a large-tracking shift in relative phase between the reference and probe light arms over a range (see graph 600 of FIG. 6) corresponding roughly to a displacement that extends from a value equal to minus the low coherence length to a value equal to plus the low coherence length of the light input thereto. The modulating voltage thereafter applied to each of splitter-modulators 312t1, 312t2 and 312t3 and each of combiner-modulators 316r1, 316r2 and 316r3, which is cyclically-scanned, has a relatively small maximum magnitude to provide it with a small modulation depth that permits the amount of phase shift provided thereby to be varied over a fine tracking range (see graph 700 of FIG. 7) corresponding to the precision tracking range typical of interferometers.

In a second preferred case, either the group of splitter-modulators or the group of combiner-modulators (but not both groups) is selected, and the modulating voltage is first applied solely to the modulators of the selected group. Further, in this second preferred case, the maximum of each of the negative and positive values of magnitude must be increased from −M and +M by an amount sufficient to provide the aforesaid coarse-tracking shift in relative phase between the reference and probe light arms over a range corresponding roughly to a displacement that extends from a value equal to minus the low coherence length to a value equal to plus the low coherence length of the light input thereto. Then, in this second preferred case, the cyclically-scanned modulating voltage having the relatively small maximum magnitude is applied solely to the modulators of the non-selected group.

Figure 2A:
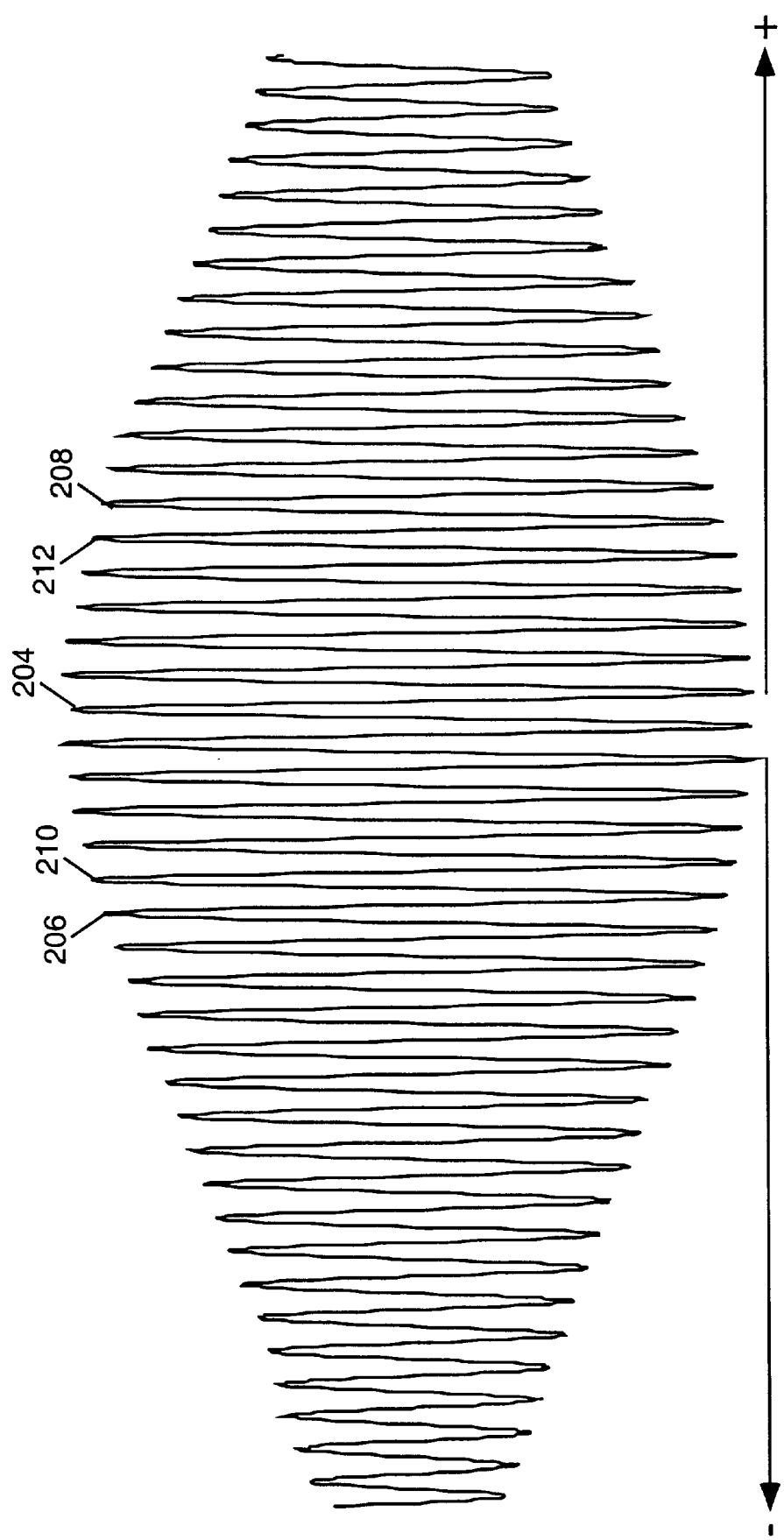
Figure 8:
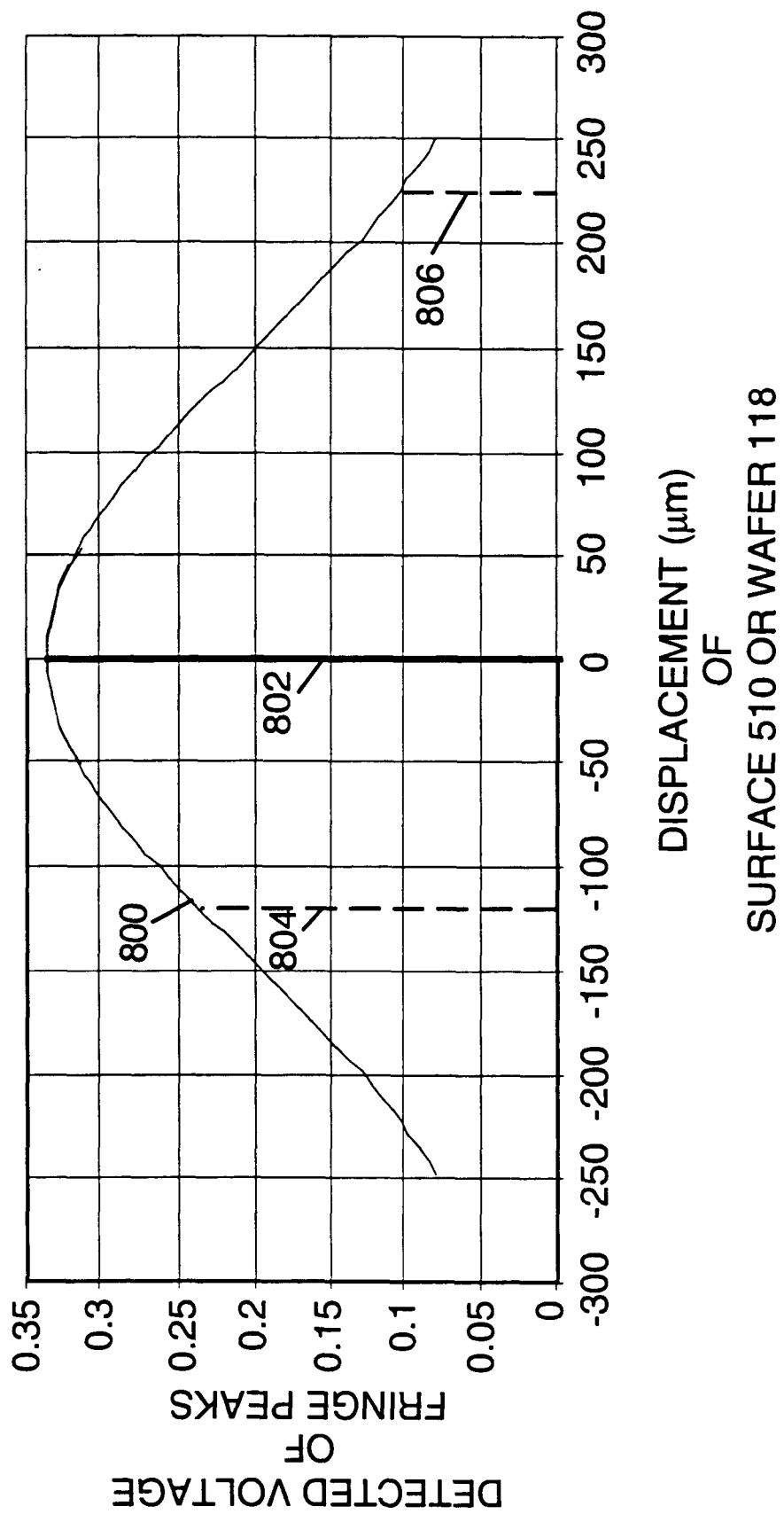
FIG. 8 is a graph showing the quantitative relationship between detected voltage of interference fringe-peak absolute values and surface displacement in the operation of both the first and second preferred embodiments of the present invention.

Reference is now made to the graph 800 of FIG. 8, which shows the quantitative relationship between the envelope of the magnitude of the voltage of interference fringe-peak absolute values (such as shown in FIG. 2a) detected by each of the 3 channels of detectors 306 and the displacement distance of wafer 118 from the plane of the focus field of the projection optical system of the stepper. In FIG. 8, the thick line 802 represents the detected absolute value magnitude of the principal interference fringe which occurs when there is a "0" displacement value (i.e., when the surface of wafer 118 is spatially located in coincidence with a selected plane, which selected plane, solely for illustrative purposes, is assumed to be the plane of the focus field). Should wafer 118 be negatively displaced to a location closer to probe plate 132, the voltage absolute-value magnitude of a detected interference fringe-peak (e.g., exemplified by dashed line 804) becomes smaller than the detected absolute-value magnitude value of the principal interference fringe by an amount which depends on the absolute value of this negative displacement in location (for reasons discussed above in connection with FIG. 2a). Similarly, should wafer 118 be positively displaced to a location further away from probe plate 132, the voltage magnitude of a detected interference fringe-peak (e.g., exemplified by dashed line 806) becomes smaller than the detected magnitude value of the principal interference fringe by an amount which also depends on the absolute value of this positive displacement in location (as discussed above in connection with FIG. 2a). Thus, within the low coherence length of the light from SLED 300, the voltage magnitude of the detected interference fringe-peak is an analog for the absolute value of either negative or positive displacement of the location of wafer 118 from its coincidence with the plane of the focus field. A sharper marker of the principal interference fringe can be obtained, if desired, by injecting some white light (i.e., very broad bandwidth light) in addition to the SLED light. This generates a sharp peak at the principal interference fringe position, making the position of the principal interference fringe clearly obvious.

During an initial operation of the stepper, the computer controlled servo means has distance-indicating control data supplied thereto from the fiber-optic interferometer shown in FIGS. 3, 3a and 3b from which the servo means can compute a digital offset value. This distance-indicating control data includes a first group of digital samples derived from successive voltage magnitude values of the aforesaid large-scan modulating voltage that is applied first to the spitter and/or combiner modulators, together with a second group of digital samples defining the magnitude of each detected voltage that results in response to a corresponding one of the successive voltage magnitude values defined by the first group of digital samples. The computer may men use the respective digital values of the samples of the first and second groups to compute a curve shape. The computed curve shape will be symmetrical about the principal interference fringe (as shown in FIG. 8) only when the location of wafer 118 substantially coincides with the focus field. However, if wafer 118 is negatively displaced in location from the focus field, the computed curve shape will be asymmetrical with the relative magnitudes of the digital samples defining the right-half of the curve shape being larger than the relative magnitudes of the corresponding digital samples defining the left-half of the curve shape. Similarly, if wafer 118 is positively displaced in location from the focus field, the computed curve shape will be asymmetrical with the relative magnitudes of the digital samples defining the left-half of the curve shape being larger than the relative magnitudes of the corresponding digital samples defining the right-half of the curve shape. This permits the digital offset value to be computed in accordance with the amount of right or left asymmetry determined by the input data. The computed digital offset value (which is stored) can thereafter be used as a command value (in a manner known in the art of computer-controlled servo means) to cause the stepper to effect the movement of the location of wafer 118 into substantial coincidence with the focus field.

After the aforesaid operation of the stepper (which places the location of wafer 118 into substantial coincidence with the focus field), each stepping operation of the stepper results in the location of wafer 118 being negatively or positively displaced by a small amount from its substantial coincidence with the focus field. However, the computer-controlled servo means stepper responds to additional input data supplied from the fiber-optic interferometer shown in FIGS. 3, 3a and 3b to initially place and then, after each step by the stepper, restore the location of wafer 118 into precise coincidence with the focus field. More particularly, this additional input data includes a third group of digital samples defining successive voltage magnitude values that comprise each individual cycle of a cyclically-scanned modulating voltage having a relatively small magnitude range when applied to the splitter and/or combiner modulators, together with a fourth group of digital samples defining the magnitude of each detected voltage that results in response to a corresponding one of the successive voltage magnitude values defined by the third group of digital samples. The additional data then may be utilized to control the movement of the stepper in a manner that tracks the interferometer phase continually to initially place, and then restore, the location of wafer 118 into precise coincidence with the focus field. Fuih,, operation of the fiberoptic interferometer shown in FIGS. 3, 3a and 3b in each of its three channels prevents any 2D tilt of the plane of the surface of wafer 118 with respect to the plane of the focus field from occurring and insures that the plane of the surface of wafer 118 will precisely coincide with the plane of the focus field.

In the case of the fiber-optic interferometer shown in FIGS. 4, 4a and 4b, gratings are utilized for splitting input light into separate reference light beams and probe light beams and then combining the split reference light beams and probe light beams into output light. Therefore, is not necessary to use spitter-modulators $412r1$, $412r2$ and $412r3$ to perform the function of splitting input light into separate reference and probe light arms or to use combiner-modulators $416r$, $416r2$ and $416r3$ to perform the function of combining the separate reference and probe light arms into output light. However, splitter-modulators $412r1$, $412r2$ and $412r3$ and combiner-modulators $416r1$, $416r2$ and $416r3$ are still required to provide a reference light arm optical length which exceeds its probe light arm optical length by a preselected amount in the absence of any modulating voltage being applied thereto, such that the total excess in reference light arm optical length of each operational pair of splitter and combiner modulators is substantially equal to the amount by which the optical length of the air path probe light arm beam would exceed the optical length of the air path reference light beam for the particular case in which the distance between the surface of wafer 118 and the bottom of folding prism 110 is equal to the nominal focus distance of 3 to 6 mm. However, each one of each pair of corresponding ordinal ones of splitter-modulators $412r1$, $412r2$ and $412r3$ and combiner-modulators $416r1$, $416r2$ and $416r3$ performs the additional function of phase shifting the reference and probe light arms in a manner identical to that described above in connection with splitter-modulators $312t1$, $312t2$ and $312t3$ and combiner-modulators $316r1$, $316r2$ and $316r3$. Further, input data from the fiber-optic interferometer shown in FIGS. 4, 4a and 4b is supplied to the computer-controlled servo means to cause the operation thereof to move the plane of the surface of wafer 118 into precise coincidence with the plane of the focus field in a manner identical to that described above in connection with FIGS. 3, 3a and 3b.

As known, a single-mode, polarization-preserving optical fiber propagates one of two orthogonally-spaced modes of light therethrough at a relatively fast phase velocity and the other of the two orthogonally-spaced modes of light therethrough at a relatively slow phase velocity. The difference between the fast and slow phase velocities depends on the temperature of the single-mode, polarization-preserving optical fiber. So long as a reference-light propagating fiber and a probe-light propagating fiber are located in dose proximity to one another (as has been assumed in FIGS. 3a–3b and FIGS. 4a–4b), changes in this difference due to temperature drift will be substantially the same in both fibers. However, it is sometimes impractical in fiber-optic interferometers to have both the reference and probe optical fibers in close proximity to one another. In such cases, polarization splitters, such as schematically shown in FIG. 9, may be used in a structural modification of either probe plate means 304-1, shown in FIGS. 3a and 3b, or probe plate means 404-1, shown in FIGS. 4a and 4b, to compensate for the difference in reference and probe optical paths that is caused by ambient temperature fluctuations.

Figure 9:
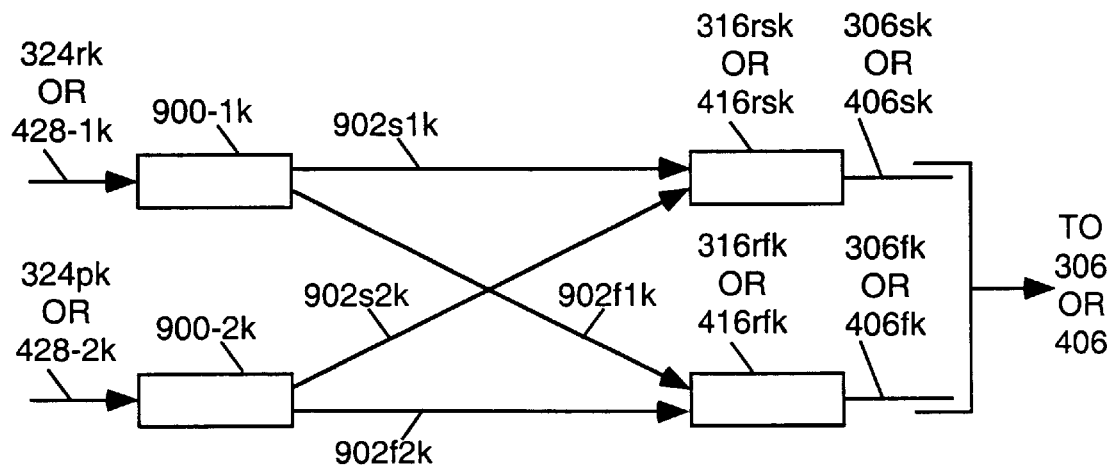
FIG. 9 is a schematic diagram of a modification of the probe plate means shown in FIGS. 3a–3b or the probe plate means shown in FIGS. 4a–4b.

As indicated in FIG. 9, the polarized light from optical fiber $324rk$ (where $1 \leq k \leq 3$) or optical fiber $428\text{-}1k$ is split into slow phase-velocity output light and fast phase-velocity output light by first polarization splitter $900\text{-}1k$, while the polarized light from optical fiber $324pk$ or optical fiber $428\text{-}2k$ is split into slow phase-velocity output light and fast phase-velocity output light by second polarization splitter $900\text{-}2k$. The slow phase-velocity output light from polarization splitter $900\text{-}1k$ is forwarded by optical fiber $902s1k$ as a first input to slow phase-velocity combiner modulator $316rsk$ or $416rsk$, while the slow phase-velocity output light from polarization splitter $900\text{-}2k$ is forwarded by optical fiber $902s2k$ as a second input to slow phase-velocity combiner modulator $316rsk$ or $416rsk$. Similarly, the fast phase-velocity output light from polarization splitter $900\text{-}1k$ is forwarded by optical fiber $902f1k$ as a first input to fast phase-velocity combiner modulator $316rfk$ or $416rfk$, while the fast phase-velocity output light from polarization splitter $900\text{-}2k$ is forwarded by optical fiber $902f2k$ as a second input to fast phase-velocity combiner modulator $316rfk$ or $416rfk$. The output light from slow phase-velocity combiner modulator $316rsk$ or $416rsk$ is forwarded by optical fiber $306sk$ or $406sk$ as an input to a first of a given pair of detectors of detectors 306 or 406, while the output light from fast phase-velocity combiner modulator $316rfk$ or $416rfk$ is forwarded by optical fiber $306fk$ or $406fk$ as an input to a second of the given pair of detectors of detectors 306 or 406. Thus, in the modification of FIG. 9, each individual channel of detectors 306 or each individual channel of detectors 406 comprises a separate pair of detectors. The total optical paths for each of the slow phase-velocity mode light and the fast phase-velocity mode light in all the single-mode, polarization-preserving optical fibers and air paths, employed for forwarding the light output from SLED 300 all the way to the individual detectors of detectors 306 or the light output from SLED 400 all the way to the individual detectors of detectors 406, have to be adjusted independently because of the difference in propagation velocity between of the slow phase-velocity mode light and the fast phase-velocity mode light. From the respective output voltages derived by each detector of a pair of detectors comprising an individual channel, together with knowledge of the lengths and thermal coefficients of the optical fibers, it is now possible to distinguish between the relative phase shifts due to relative temperature drifts and those due to motions of the measurement surface.

It should be understood that the light source of the present invention may employ a light source comprising a plurality of n independent SLED'S for deriving n ($n \geq 3$) channels of low-coherence-length light, rather than employing the preferred light source comprising a single SLED and an n-branch splitter for deriving the n channels of low-coherence-length light.

It should also be understood that the present invention contemplates both the use of known mechanical and electro optical splitter modulators and combiner-modulators other than the above-described integrated polarizing lithium-niobate Y splitter-modulators and combiner-modulators to perform the splitting, combining and/or phase-modulating functions of the present invention.

It should be further understood that the reference light beam need not be directly transmitted parallel to the probe plate from transmitter to receiver (in the manner shown in FIGS. 2, 3a and 3b, and 4a and 4b), but, alternatively, the path of the reference light beam from transmitter to receiver could involve reflection from one or more unshown surfaces.

While the fiber-optic interferometer employing low-coherence-length light of the present invention has been specifically described in connection with its use as a metrology tool useful in the projection optical system of a microlithographic stepper to maintain the surface plane of a movable wafer surface precisely coincident with the plane of the focus field of an image of one or more reticle patterns, it should be understood that such a metrology tool is broadly useful in precisely measuring the distance between any two points that may vary in value from a given distance value by an amount which is within the low-coherence-length of the light employed by the fiber-optic interferometer.

What is claimed is:

1. An apparatus for measuring a distance between a first point in a reference plane and a second point in a member plane with said member plane adjacent said reference plane, wherein said apparatus comprises:

a low-coherence-length light source generating light of a selected wavelength; and a fiber-optic interferometer coupled to said light source to receive said light as an input thereto, from said light said interferometer produces both a distance-probing light beam and a reference light beam with each of said light beams having said selected wavelength, with said reference light beam projected directly across said reference plane and said distance-probing light beam projected from said reference plane to said second point in said member plane from which said distance probing light beam is reflected to intersect said reference beam in said reference plane, when so projected said light beam is out of phase with said reference light beam producing an interference pattern, said interference pattern includes a principal interference fringe, with an output light having an intensity that is a function of the difference in optical path lengths traversed by said distance-probing light beam and said reference light beam;

said distance has a direct geometric relationship to said difference in optical path lengths, said distance having a value that may vary from a given distance value by an amount which is within a given range of distance values, which given range is many times larger than said selected wavelength;

said light generated by said light source comprises light having a coherence length over said given range of distance values that is sufficiently low to cause the peak intensity of said output light for each interference fringe other than said principal interference fringe to be lower than the peak intensity output light for the principal interference fringe by a significantly noticeable amount that depends on the absolute value of the number of wavelengths that that interference fringe is displaced in distance from the principal interference fringe;

said low-coherence-length fiber-optic interferometer measures the absolute shortest distance between said first point in said reference plane and said second point in said member plane, that distance may vary from said given distance value by an amount that is within said given range of distance values.

2. The apparatus defined in claim 1, wherein said given range of distance values within which said distance value may vary from said given distance value is substantially ±250 μm with respect to said given distance value.

3. The apparatus defined in claim 1, wherein said light source comprises a superluminescent light-emitting diode (SLED) for generating said low-coherence-length light.

4. The apparatus defined in claim 3, wherein said low-coherence-length light generated by said SLED has a nominal wavelength of substantially 830 nm and a bandwidth of at least 20 nm.

5. The apparatus defined in claim 1, wherein said reference plane is a reference surface said member plane is a movable surface with said first and second points corresponding to points located at said distance from from each other that may vary from said given distance value by an amount which is within said given range of distance values.

6. The apparatus defined in claim 5, wherein said fiber-optic interferometer comprises:

a light detector;

a probe plate disposed on said reference surface;

a light-transmitter, including a first optical-fiber conduit which forwards said low-coherence-length light from said light source to said probe plate, (1) derive and then transmit said reference light beam along a first air path through said first point and (2) derive and then transmit said distance-probing light beam along a first portion of a second air path directed to be incident at a glancing angle at said second point on said movable surface; and a light-receptor, including a second optical-fiber conduit which forwards received low-coherence-length light from said probe plate to said light detector, to (1) receive said reference light beam transmitted over said first air path and (2) receive said distance-probing light beam reflected from said second point on said movable surface and then transmitted back to said reference surface of said probe plate along a second portion of said second air path.

7. The apparatus defined in claim 6, wherein said first air path is directed substantially parallel to said reference surface.

8. The apparatus defined in claim 6, wherein each of said first and second first optical-fiber conduits comprises single-mode, polarization-preserving optical fibers.

9. The apparatus defined in claim 8, wherein:

said light-transmitter further comprises:

a polarizing splitter-modulator to (1) split said low-coherence-length light from said light source into separate reference-arm light and probe-arm light and (2) phase-modulate said reference-arm light and probe-arm light with respect to one another by an amount in accordance with the magnitude of a first modulation voltage applied thereto;

a transmitting reference-arm gradient-index microlens to derive said transmitted reference light beam from said modulated reference-arm light; and a transmitting probe-arm gradient-index microlens to derive said transmitted distance-probing light beam from said modulated probe-arm light; and said light-receptor further comprises;

a receiving reference-arm gradient-index microlens to receive said reference light beam transmitted over said first air path;

a receiving probe-arm gradient-index microlens to receive said distance-probing light beam transmitted over said second air path; and a polarizing combiner-modulator to (1) phase-modulate said received reference-arm light and probe-arm light with respect to one another by an amount in accordance with the magnitude of a second modulation voltage applied thereto and (2) combine the modulated said received reference-arm light and probe-arm light into a combined light that is forwarded to said light detector by said second optical fiber conduit.

10. The apparatus defined in claim 9, wherein each of said polarizing splitter-modulator and said polarizing combiner-modulator comprises an integrated polarizing lithium-niobate Y splitter-modulator.

11. The apparatus defined in claim 9 wherein: said polarizing combiner-modulator including:

a first polarization splitter to split said received reference-arm light into slow phase-velocity reference-arm light and fast phase-velocity reference-arm light;

a second polarization splitter to split said received probe-arm light into slow phase-velocity probe-arm light and fast phase-velocity probe-arm light;

a first polarizing combiner-modulator to (1) phase-modulate said slow phase-velocity reference-arm light and slow phase-velocity probe-arm light with respect to one another by an amount in accordance with the magnitude of a first modulating voltage applied thereto and (2) combine the modulated said slow phase-velocity reference-arm light and slow phase-velocity probe-arm light into combined light that is forwarded to said light detector by said second optical fiber conduit; and a second polarizing combiner-modulator to (1) phase-modulate said fast phase-velocity reference-arm light and fast phase-velocity probe-arm light with respect to one another by an amount in accordance with the magnitude of a second modulating voltage applied thereto and (2) combine said modulated fast phase-velocity reference-arm light and fast phase-velocity probe-arm light into combined light that is forwarded to said light detector by said second optical fiber conduit.

12. The apparatus defined in claim 11, wherein each of said first and second polarizing combiner-modulators comprises an integrated polarizing lithium-niobate Y combiner-modulator.

13. The apparatus defined in claim 9, wherein:

said first in any of a set of n displaced points (where $n \geq 3$) on said reference surface which do not lie on a straight line and said second point is a corresponding set of n displaced points on said movable surface;

said light source comprises means for deriving n channels of low-coherence-length light;

said light-transmitter comprises, for each of said n channels;
an individual one of a set of n of said polarizing splitter-modulators;
a corresponding individual one of a set of n of said transmitting reference-arm gradient-index microlenses; and
a corresponding individual one of a set of n of said transmitting probe-arm gradient-index microlenses; and said light-receptor comprises, for each of said n channels
an individual one of a set of n of said receiving reference-arm gradient-index microlenses;
a corresponding individual one of a set of n of said receiving probe-arm gradient-index microlenses; and
a corresponding individual one of a set of n of said polarizing combiner-modulators.

14. The apparatus defined in claim 13, wherein said means for deriving n channels of low-coherence-length light comprises an n-tree splitter to split low-coherence-length light generated by a single light source into n branches of low-coherence-length light.

15. The apparatus defined in claim 8, wherein:
said light-transmitter further comprises:
a transmitting gradient-index microlens and grating to derive both said transmitted reference light beam and said distance-probing light beam from said low-coherence-length light from said light source;
said light-receptor further comprises:
a receiving gradient-index microlens and grating to receive both said transmitted reference light beam and said distance-probing light beam and combining them into a single light output therefrom;
a polarizing splitter-modulator to (1) split said single light output into separate first-arm and second-arm light and (2) phase-modulate said first-arm light and second-arm light with respect to one another by an amount in accordance with the magnitude of a first modulation voltage applied thereto; and
a polarizing combiner-modulator to (1) phase-modulate said first-arm light and second-arm light with respect to one another by an amount in accordance with the magnitude of a second modulation voltage applied thereto and (2) combine and equalize optical path lengths of the modulated said first-arm light and second-arm light into a combined light that is forwarded to said light detector by said second optical fiber conduit.

16. The apparatus defined in claim 15, wherein each of said polarizing splitter-modulator and said polarizing combiner-modulator comprises an integrated polarizing lithium-niobate Y splitter-modulator.

17. The apparatus defined in claim 15 wherein:
said polarizing splitter-modulator includes:
a first polarization splitter to split said received reference-arm light into slow phase-velocity reference-arm light and fast phase-velocity reference-arm light; and
a second polarization splitter to split said received probe-arm light into slow phase-velocity probe-arm light and fast phase-velocity probe-arm light; and
said polarizing combiner-modulator includes:
a first polarization combiner-modulator to (1) phase-modulate said slow phase-velocity reference-arm light and slow phase-velocity probe-arm light with respect to one another by an amount in accordance with the magnitude of a first modulating voltage applied thereto and (2) combine the modulated said slow phase-velocity reference-arm light and slow phase-velocity probe-arm light into a first combined light that is forwarded to said light detector by said second optical fiber conduit; and
a second polarizing combiner-modulator to (1) phase-modulate said fast phase-velocity reference-arm light and fast phase-velocity probe-arm light with respect to one another by an amount in accordance with the magnitude of a second modulating voltage applied thereto and (2) combine the modulated said fast phase-velocity reference-arm light and fast phase-velocity probe-arm light into a second combined light that is forwarded to said light detector by said second optical fiber conduit.

18. The apparatus defined in claim 17, wherein each of said first and second polarizing combiner-modulators comprises an integrated polarizing lithium-niobate Y combiner-modulator.

19. The apparatus defined in claim 15, wherein said first point is any of a set of n displaced points (where $n \geq 3$) on said reference surface which do not lie on a straight line and said second point is a corresponding set of n displaced points on said movable surface, wherein said light source comprises means for deriving n channels of low-coherence-length light, and wherein:
said light-transmitter comprises, for each of said n channels, an individual one of a set of n of said polarizing splitter-modulators, a corresponding individual one of a set of n of said transmitting reference-arm gradient-index microlenses and a corresponding individual one of a set of n of said transmitting probe-arm gradient-index microlenses; and
said light-receptor comprises, for each of said n channels, an individual one of a set of n of said receiving reference-arm gradient-index microlenses, a corresponding individual one of a set of n of said receiving probe-arm gradient-index microlenses, and a corresponding individual one of a set of n of said polarizing combiner-modulators.

20. The apparatus defined in claim 13, wherein said means for deriving n channels of low-coherence-length light comprises an n-tree splitter for splitting low-coherence-length light generated by a single light source into n branches of low-coherence-length light.

21. The apparatus defined in claim 8, wherein:

said probe plate is fixedly attached to a surface of a projection optical system of a microlithographic stepper which derives a plane of the focus field of an image of one or more reticle patterns that is located said given distance from said reference surface of said probe plate means;

said movable surface is a selected surface of a wafer supported by an X-Y stage of said stepper; and said X-Y stage is moved by computer-controlled servo means of said stepper;

whereby said low-coherence-length fiber-optic interferometer may be employed to generate distance-indicating control data that may be forwarded to said computer-controlled servo means to cause said servo means to bring a displaced plane of said selected surface of said wafer into precise coincidence with the plane of said focus field, so long as the amount of displacement is within said given range of distance values.

* * * * *